(12) United States Patent
Chen et al.

(10) Patent No.: US 8,749,737 B2
(45) Date of Patent: Jun. 10, 2014

(54) DISPLAY WITH COLOR CONTROL

(75) Inventors: Cheng Chen, Cupertino, CA (US); John Z. Zhong, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 231 days.

(21) Appl. No.: 13/103,726

(22) Filed: May 9, 2011

(65) Prior Publication Data

US 2012/0287605 A1 Nov. 15, 2012

(51) Int. Cl.
*G02F 1/1335* (2006.01)
*G02F 1/1333* (2006.01)

(52) U.S. Cl.
USPC ............ 349/110; 349/106; 349/109; 349/114

(58) Field of Classification Search
USPC .......................... 349/106, 109–110, 113–114
See application file for complete search history.

(56) References Cited

U.S. PATENT DOCUMENTS

| | | | |
|---|---|---|---|
| 6,476,783 B2 * | 11/2002 | Matthies et al. | 345/82 |
| 7,102,709 B2 | 9/2006 | Nakano et al. | |
| 7,864,271 B2 * | 1/2011 | Nakamura et al. | 349/109 |
| 2002/0021388 A1 | 2/2002 | Nakamura et al. | |
| 2006/0066778 A1 * | 3/2006 | Miyazaki | 349/106 |
| 2006/0290872 A1 * | 12/2006 | Morii et al. | 349/156 |
| 2007/0064185 A1 * | 3/2007 | Kim et al. | 349/114 |

* cited by examiner

*Primary Examiner* — Nathanael R Briggs
(74) *Attorney, Agent, or Firm* — Fletcher Yoder PC

(57) ABSTRACT

Techniques are provided for controlling the colors of reflected light out of a display surface in a display device, such that display discoloration (e.g., green tinting) may be reduced, particularly when the display is operating in bright ambient environments. In one embodiment, a display device may include a color filter black mask layer having an arrangement of red, green, and blue color filter areas, where the red and/or blue color filter areas are substantially greater than the green color filter area. In some embodiments, the display device may include red and blue color filter pigment resin areas which may be disposed over the reflective areas to increase the overall amount of red and blue light that will be generated by reflected light to result in a total light reflection that is substantially neutral in color.

22 Claims, 6 Drawing Sheets

DISPLAY WITH COLOR CONTROL

BACKGROUND

The present disclosure relates generally to display devices, and more particularly, to techniques for controlling colors displayed by display devices.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Liquid crystal displays (LCDs) are commonly used as screens or displays for a wide variety of electronic devices, including such consumer electronics as televisions, computers, and handheld devices (e.g., cellular telephones, audio and video players, gaming systems, and so forth). Such LCD devices typically provide a flat display in a relatively thin package that is suitable for use in a variety of electronic goods.

LCD devices typically include multiple layers, including a backlight, an LCD panel having a pixel matrix configured to selectively modulate the amount and color of light transmitted from the backlight, and a color filter layer which enables specific colors of light to be emitted (e.g., red, green, and blue). LCD devices also typically include one or more optical layers from which external light (i.e., ambient light, such as from sunlight, lamplight, etc.) may be reflected. Due to the reflection of external light, LCD devices may be readable under direct sunlight, even if the backlight is not actively transmitting light through the LCD device. More specifically, external light may propagate through the layers of the LCD devices to be reflected by one or more optical layers out of the LCD device. The reflected external light may form images on the display surface as it passes through the liquid crystal panel and color filter layer. However, the reflection of external light may sometimes contribute to undesirable display effects. For instance, reflected external light may contribute to a green tint on a display surface, particularly in brightly lit environments.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure generally relates to techniques for controlling the reflection of colors out of a display. In particular, display discoloration, such as green tinting, may be reduced, particularly when the display is operating in bright ambient environments. In one embodiment, a color filter and black mask layer may be configured to have red and/or blue color filters which each cover a larger area through which reflected light is color-filtered, compared to green color filters. For example, red and/or blue color filters may be extended over reflective areas of corresponding red and/or blue pixels, such as the data lines, gate lines, thin film transistors (TFTs), and storage capacitors in each respective pixel. In some embodiments, the black mask regions of each pixel may be altered to increase the amount of red and blue light that is reflected out from the display. Therefore, in some embodiments, the amount of external light which reflects through red and/or blue color filters may be controlled (e.g., increased) to result in displayed images having a substantially neutral color.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
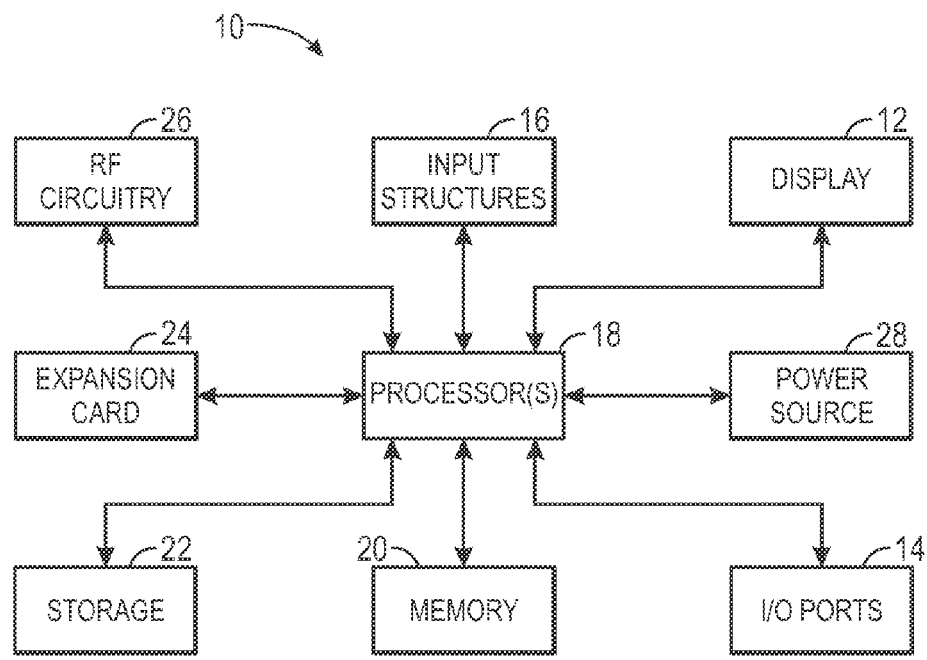
FIG. 1 is a block diagram of an electronic device, in accordance with aspects of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

One or more embodiments are directed towards controlling the light reflected from a display device. Display devices typically include multiple layers, including a backlight, an pixel matrix layer configured to selectively modulate the amount and color of light transmitted from the backlight, and a color filter layer which color filters light such that specific wavelengths of light are emitted (e.g., visible light having red, green, and blue wavelengths). Display devices also typically include one or more optical layers from which external light (i.e., ambient light, such as from sunlight, lamplight, etc.) may be reflected. In some embodiments, the reflected external light may propagate to the display surface to contribute to the illumination of the display, thereby conserving power consumption while increasing pixel illumination. Moreover, in some embodiments, due to the reflectivity of such optical layers, display devices may be readable in bright ambient conditions (e.g., under direct sunlight or under lamplight), even if the backlight is not actively transmitting light through the display. More specifically, external light may impinge a top surface of the display device and propagate through the display layers (e.g., the pixel matrix layer, the color filter layer, etc.) to be reflected out of the display by one or more optical layers. The reflected external light may form colored images on the display surface as it passes through the light modulating pixel matrix layer and the color filter layer.

While the reflection of external light may be desirable for certain purposes (e.g., increasing illumination without expending extra power, displaying colored images without transmitting backlight, etc), such reflections may also contribute to undesirable display effects. For instance, due to the configuration of typical display devices and certain properties of visible light, more light having green wavelengths may be reflected out of the display, in comparison to light having red or blue wavelengths. Increased reflections of light having green wavelengths may be perceived by a user of the display device as a green tint throughout the display surface, particularly in brightly lit environments. Such a green tint may decrease the quality of the displayed images.

In one or more embodiments, a display device includes a color filter and/or black mask layer configured to result in a substantially neutral color of light propagating out of a display screen of the display device. Propagating light may include any light which propagates into or out of layers in a display device, including transmitted internal light (e.g., backlight, OLEDs, or other light source within the display device) and reflected external light (e.g., sunlight, lamplight, or other ambient light from a source external to the display device). Moreover, reflected external light may include portions of external light which reflect from any reflective surface within the display device, including, for example, optical layers, reflective layers, transmissive layers, and/or other reflective components of the display. Light which propagates out of the display screen may be viewed by a user of the display device and may include a combination of transmitted internal light and reflected external light, depending on the operation of the display device and/or the ambient light conditions in which the display device is operating. Furthermore, light propagating out of the display device may be referred as substantially balanced when the display device can generate a neutral color to be viewed by a user, even when the display device is operating in bright ambient conditions. For instance, in display devices having red, green, and blue colored pixels, the color filter and/or black mask layer may be configured such that the red, green, and blue wavelengths of light propagating out of the display screen are substantially balanced to generate a neutral color.

In one embodiment, display discoloration (i.e., when the light propagating out of the display screen is not substantially balanced) can be reduced by controlling size of certain color filters (e.g., red, green, and/or blue) through which reflected light can be transmitted and color filtered. For example, display discoloration such as green tinting may be reduced by configuring the color filter and black mask layer such that red pixels and/or blue pixels have a larger area for color filtering red and/or blue reflected light, as compared to green pixels.

In one embodiment, red and blue pixels may each have a corresponding red or blue color filter pigment resin area that is disposed not only over the transmissive areas of the respective red of blue pixel, but also over the reflective areas of the respective pixel. For example, the red or blue color filter areas may be disposed over reflective areas such as data lines, gate lines, thin film transistors (TFTs), and storage capacitors in each respective red pixel or blue pixel. In some embodiments, the black mask regions of each red pixel or blue pixel may be altered to control the amount of red and blue light is reflected out from the display, such that the total red, blue and green light propagating out of the display screen is substantially balanced. Therefore, in some embodiments, the color filter and black mask layer may be configured to increase the areas through which external light may be reflected through red and/or blue color filter pigment resin areas such that the total red, blue, and green light propagating out of the display screen is substantially balanced. By increasing the areas through which red and/or blue light is reflected, the color of displayed images may be neutralized, and discoloration such as green tinting may be reduced.

Prior to discussing the above summarized techniques in detail, it is useful to understand certain examples of devices in which such techniques may be used. As may be appreciated, electronic devices may include various internal and/or external components which contribute to the function of the device. For instance, FIG. 1 is a block diagram illustrating components that may be present in one such electronic device 10. Those of ordinary skill in the art will appreciate that the various functional blocks shown in FIG. 1 may include hardware elements (including circuitry), software elements (including computer code stored on a computer-readable medium, such as a hard drive or system memory), or a combination of both hardware and software elements. FIG. 1 is only one example of a particular implementation and is merely intended to illustrate the types of components that may be present in the electronic device 10. For example, in the presently illustrated embodiment, these components may include a display 12, input/output (I/O) ports 14, input structures 16, one or more processors 18, one or more memory devices 20, non-volatile storage 22, expansion card(s) 24, networking device 26, and power source 28.

The display 12 may be used to display various images generated by the electronic device 10. The display 12 may be any suitable display, such as a liquid crystal display (LCD) or an organic light-emitting diode (OLED) display. Additionally, in certain embodiments of the electronic device 10, the display 12 may be provided in conjunction with a touch-sensitive element, such as a touch-screen, that may be used as part of the control interface for the device 10. The display 12 may also include a light source (e.g., backlight, OLED panel, etc.), various optical layers, and a matrix of pixels and circuitry for modulating the transmittance of light through each pixel to display an image, as will be discussed.

Figure 2:
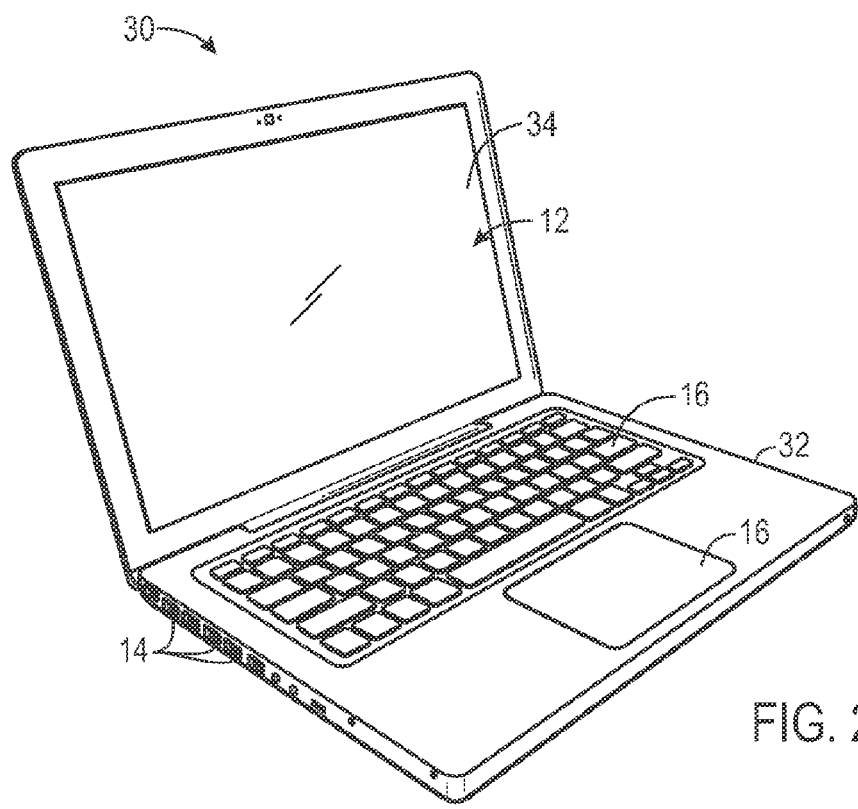
FIG. 2 is a perspective view of a computer in accordance with aspects of the present disclosure.

The electronic device 10 may take the form of a computer system or some other type of electronic device. Such computers may include computers that are generally portable (such as laptop, notebook, tablet, and handheld computers), as well as computers that are generally used in one place (such as conventional desktop computers, workstations and/or servers). In certain embodiments, electronic device 10 in the form of a computer may include a model of a MacBook®, MacBook® Pro, MacBook Air®, IMac®, Mac® mini, or Mac Pro® available from Apple Inc. of Cupertino, Calif. By way of example, an electronic device 10 in the form of a laptop computer 30 is illustrated in FIG. 2 in accordance with one embodiment. The depicted computer 30 includes a housing 32, a display 12 (e.g., in the form of an LCD 34 or some other suitable display), I/O ports 14, and input structures 16.

The display 12 may be integrated with the computer 30 (e.g., such as the display of the depicted laptop computer) or may be a standalone display that interfaces with the computer 30 using one of the I/O ports 14, such as via a DisplayPort, Digital Visual Interface (DVI), High-Definition Multimedia Interface (HDMI), or analog (D-sub) interface. For instance, in certain embodiments, such a standalone display 12 may be a model of an Apple Cinema Display®, available from Apple Inc.

Figure 3:
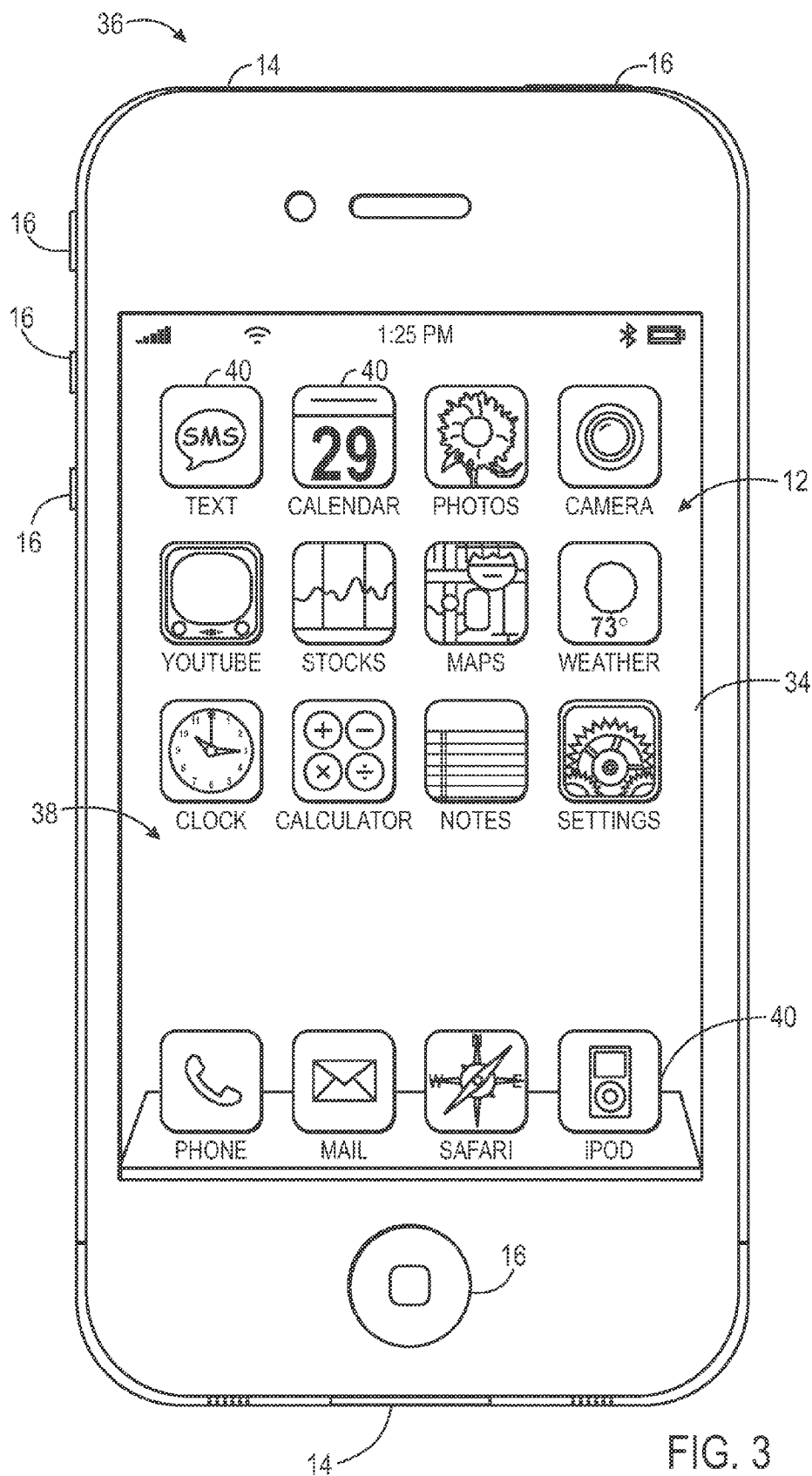
FIG. 3 is a perspective view of a handheld electronic device in accordance with aspects of the present disclosure.

Although an electronic device 10 is generally depicted in the context of a computer in FIG. 2, an electronic device 10 may also take the form of other types of electronic devices. In some embodiments, various electronic devices 10 may include mobile telephones, media players, personal data organizers, handheld game platforms, cameras, and combinations of such devices. For instance, as generally depicted in FIG. 3, the device 10 may be provided in the form of handheld electronic device 36 that includes various functionalities (such as the ability to take pictures, make telephone calls, access the Internet, communicate via email, record audio and video, listen to music, play games, and connect to wireless networks). By way of further example, handheld device 36 may be a model of an IPod®, IPod® Touch, or IPhone® available from Apple Inc. In the depicted embodiment, the handheld device 32 includes the display 12, which may be in the form of an LCD 34. The LCD 34 may display various images generated by the handheld device 32, such as a graphical user interface (GUI) 38 having one or more icons 40.

In another embodiment, the electronic device 10 may also be provided in the form of a portable multi-function tablet computing device (not illustrated). In certain embodiments, the tablet computing device may provide the functionality of two or more of a media player, a web browser, a cellular phone, a gaming platform, a personal data organizer, and so forth. By way of example only, the tablet computing device may be a model of an IPad® tablet computer, available from Apple Inc.

With the foregoing discussion in mind, it may be appreciated that an electronic device 10 in either the form of a computer 30 (FIG. 2) or a handheld device 36 (FIG. 3) may be provided with a display device 10 in the form of an LCD 34. As discussed above, an LCD 34 may be utilized for displaying respective operating system and/or application graphical user interfaces running on the electronic device 10 and/or for displaying various data files, including textual, image, video data, or any other type of visual output data that may be associated with the operation of the electronic device 10.

Figure 4:
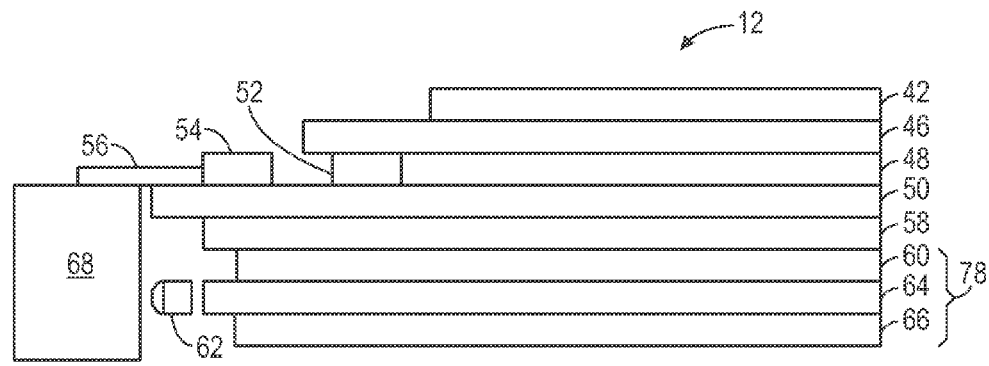
FIG. 4 is a cross-sectional side view of the display in the display device illustrated in FIG. 1, in accordance with aspects of the present disclosure.

With the foregoing in mind, and referring once again to the figures, FIG. 4 depicts a cross-sectional side view of an example of a display, such as the display 12 illustrated in FIG. 1. The display 12 includes a top polarizing layer 42 and a bottom polarizing layer 58 each configured to polarize light from a backlight assembly 78. Between the top and bottom polarizing layers 42 and 58, the display 12 may include a thin film transistor (TFT) layer 50, liquid crystal layer 48, and color filter and black mask layer 46 which together selectively modulate and color filter the light emitted through the backlight assembly 78. One or more layers of the display 12 may be encapsulated and/or surrounded by a display frame 68.

The backlight assembly 78 may include a light source 62, which may include, for example, a light emitting diode (LED), cold cathode fluorescent lamps (CCFLs), and/or hot cathode fluorescent lamps (HCFLs), or other suitable lighting device. In one embodiment, the backlight assembly 78 includes a light guide 64 configured to guide the light from the internal light source 62 throughout the display area of the display 12. The backlight assembly 78 may also include a reflector 66 disposed beneath the light guide 64 and may be configured to reflect and/or direct the light emitted by the light source 62 such that the emitted light is transmitted towards the upper layers (e.g., towards the top polarizer 42 and out of the display surface) of the display 12. In some embodiments, the backlight assembly 78 may also include one or more optical films 60 disposed over the light guide 64 through which light from the light guide 64 is transmitted towards the upper layers of the display 12. In some embodiments, the one or more optical films 60 may include reflective properties, and may reflect portions of external light which impinge the display surface and propagate through the layers of the display 12.

In some embodiments, the thin film transistor (TFT) layer 50 is disposed above the bottom polarizer 58 which is disposed over the backlight assembly 78. For simplicity of illustration, the TFT layer 50 is depicted as a generalized structure in FIG. 4. In practice, the TFT layer 50 may itself include various conductive, non-conductive, and semiconductive layers and structures which generally form the electrical devices and pathways which drive operation of the each pixel of the display 12. In some embodiments, each pixel in the display 12 may be controlled by the display driver 54 which may be coupled to display driving circuitry 56. For example, in an embodiment in which the display 12 is an FFS LCD display, the display driving circuitry 56 may control the display driver 54 to drive the TFT layer 50 through data lines (also referred to as "source lines") and scanning lines (also referred to as "gate lines") to activate pixel electrodes, and common electrodes (as well as other conductive traces and structures). Such conductive structures may be formed using transparent conductive materials, such as indium tin oxide (ITO) or indium zinc oxide (IZO), for example. In some embodiments, such conductive structures may have reflective properties which may be suitable for reflecting portions of external light which impinge the surface of the display 12, as will be further discussed.

The TFT layer 50 may further include insulating layers (such as a gate insulating film) formed from suitable transparent materials (such as silicon oxide) and semiconductive layers formed from suitable semiconductor materials (such as amorphous silicon). In general, the respective conductive structures and traces, insulating structures, and semiconductor structures may be suitably disposed to form the respective pixel electrodes and common electrodes, a TFT, and the respective data and scanning lines used to operate (e.g., activate or deactivate) each pixel in the display 12.

The liquid crystal layer 48 may be disposed over the TFT layer 50 and may include liquid crystal molecules suspended in a fluid or embedded in polymer networks. The liquid crystal molecules may be oriented or aligned with respect to an electrical field generated by the TFT layer 50. In practice, the orientation of the liquid crystal molecules in the liquid crystal layer 48 determines the amount of light (e.g., provided by the light source 64) that is transmitted through each pixel of the display 12. For example, applying a voltage to the TFT layer 50 of the pixel may generate an electric field in the liquid crystal layer 48, such that the liquid crystal molecules in the liquid crystal layer 50 may be aligned to affect the polarization of light propagating through the liquid crystal layer 48. Based on the polarization of the light passing out from the liquid crystal layer 48, the light may be absorbed by the top polarizer 42 or transmitted through the top polarizer 42.

Disposed over the liquid crystal layer 48 opposite from the TFT layer 50 may be one or more alignment and/or overcoating layers interfacing between the liquid crystal layer 48 and an overlying color filter and black mask layer 46. In some embodiments, the color filter and black mask layer 46 may be sealed with the liquid crystal layer 48 and the TFT layer 50 by a suitable sealant 52. While the color filter and black mask layer 46 in FIG. 4 is illustrated as a generalized structure, the color filter and black mask layer 46 may actually include an arrangement of red, green, and blue pigment resin areas, each surrounded by a black mask and disposed over a pixel, as will be discussed in further detail. The red, green, and blue pigment resin areas may be configured such that light passing through each color filter pigment resin area may have substantially red, green, or blue wavelengths, respectively. The black mask may be a light-opaque mask or matrix which defines a red, green, or blue pixel area and prevents light transmitted through the aperture and color filter pigment resin areas from diffusing or "bleeding" into adjacent pixels. In some embodiments, each pixel of the display 12 may correspond to a primary color (e.g., red, green, or blue) when light is transmitted from the backlight assembly 78 through the liquid crystal layer 48 and the color filter and black mask layer 46.

As previously discussed, light which propagates within the display 12 may include internal light (e.g., light emitted from a backlight assembly 78 or any other suitable internal light source) and external light (e.g., light external to the display 12 that impinges a top surface of the display 12). Light which propagates out of the display surface (i.e., out of the top polarizer 42) may include transmissions of internal light or reflections of external light.

Figure 5:
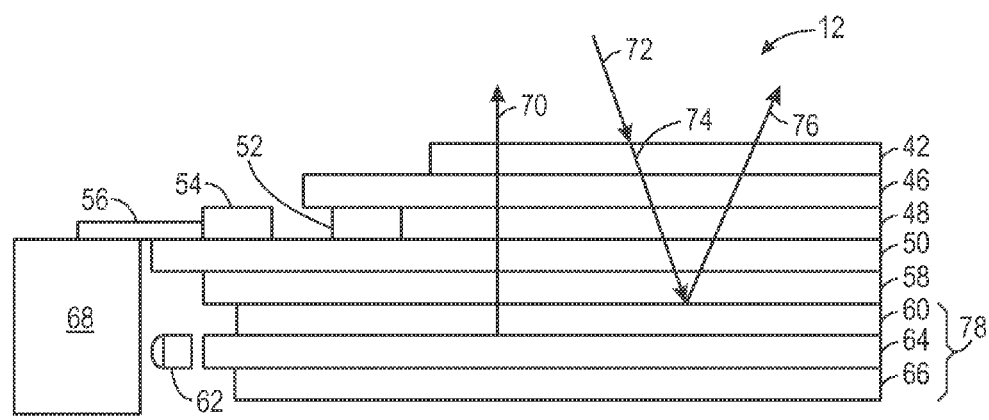
FIG. 5 is a diagram representing light transmission and reflection in the display of FIG. 4 in accordance with aspects of the present disclosure.

For example, FIG. 5 illustrates light transmission and reflection in the display 12 of FIG. 4. As illustrated in FIG. 5, internal light 70 may be emitted out from the light guide and through the optical films of the backlight assembly 78. The internal light 70 may be polarized by the bottom polarizer 58 and selectively modulated (e.g., by intensity and in color) by the TFT layer 50, the liquid crystal layer 48, and the color filter and black mask layer 46. The internal light 70 may be polarized by the top polarizer 42 and transmitted out of the display surface to be viewed by a user of the display 12.

External light 72 from any light source external to the display 12 may impinge the top surface of the display 12 and may propagate through layers of the display 12. Once external light 72 impinges the display surface to propagate within the layers of the display 12, the light, referred to as impinging light 74, may be modified in polarization, direction, and/or wavelength, etc. The impinging light 74 may be reflected by one or more optical films 60 in the display 12, resulting in reflected light 76. The reflected light 76 may also be modified in polarization, direction, and/or wavelength, etc. before it is transmitted out of the surface of the display 12 to be viewed by a user.

Figure 6:
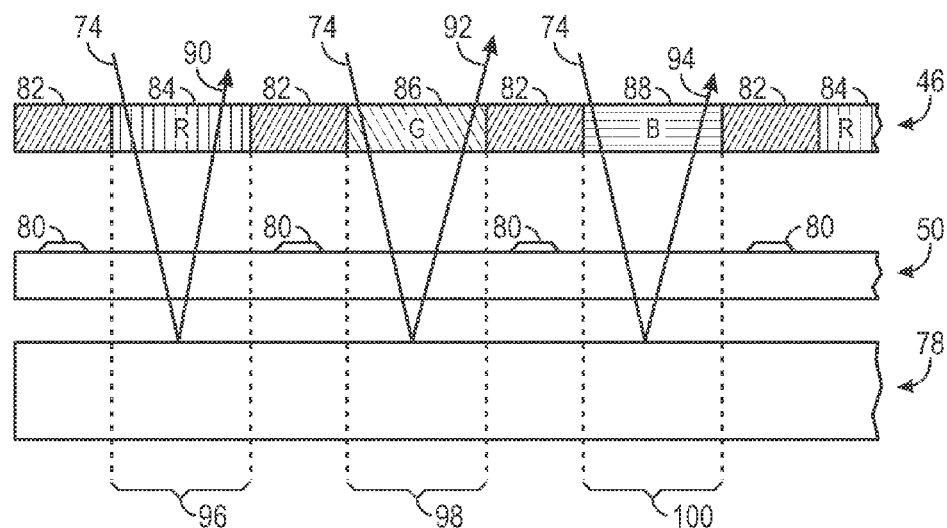
FIG. 6 is a diagram representing light reflection through a color filter and black mask layer of the display of FIG. 4 in accordance with aspects of the present disclosure.

As reflected light 76 which is viewed by a user passes through the color filter and black mask layer 46, the reflected light 76 may be different in wavelength (i.e., different in color) depending on the color of color filter pigment resin area the reflected light 76 passes through before it propagates out of the surface of the display 12. For example, as illustrated in FIG. 6, impinging light 74 may pass through the color filter and black mask layer 46, which includes an arrangement of red color filter pigment resin areas 84, green color filter pigment resin areas 86, and blue color filter pigment resin areas 88, referred to generally as a red filter 84, green filter 86, and blue filter 88, respectively. Each of the red, green, and blue filters 84, 86, and 88 may be surrounded by a black mask 82, such that the black mask and filter 84, 86, or 88 define the area and color of a red pixel 96, a green pixel 98, or a blue pixel 100 in the display 12.

Light transmitted from the backlight assembly 78 is modulated by the TFT layer 50 (which includes reflective areas 80 such as TFTs, pixel electrodes, gate lines, etc.) and liquid crystal layer 48 (FIGS. 4 and 5) and transmitted through a red filter 84, green filter 86, or blue filter 88. Similarly, when external light impinges the display surface and impinges the layers of the display 12, the impinging light 74 may propagate through the red filter 84, green filter 86, or blue filter 88, reflected by the backlight assembly 78 and be transmitted through the red filter 84, green filter 86, or blue filter 88 again to be viewed as a user as either red light 90, green light 92, or blue light 94.

Therefore, external light propagates through the layers of a display 12 twice before the reflections of external light are viewed by a viewer. However, due to certain properties of visible light, and due to the configuration of typical displays, certain wavelengths of light may be attenuated before the reflected light is transmitted out of a display to be viewed by a user, such that less light having certain wavelengths is visually perceived by the user. For example, in some displays, less red light 90 or blue light 94 may be reflected out of a typical display than green light 92, possibly resulting in undesirable display characteristics, such as green tinting.

Figure 7:
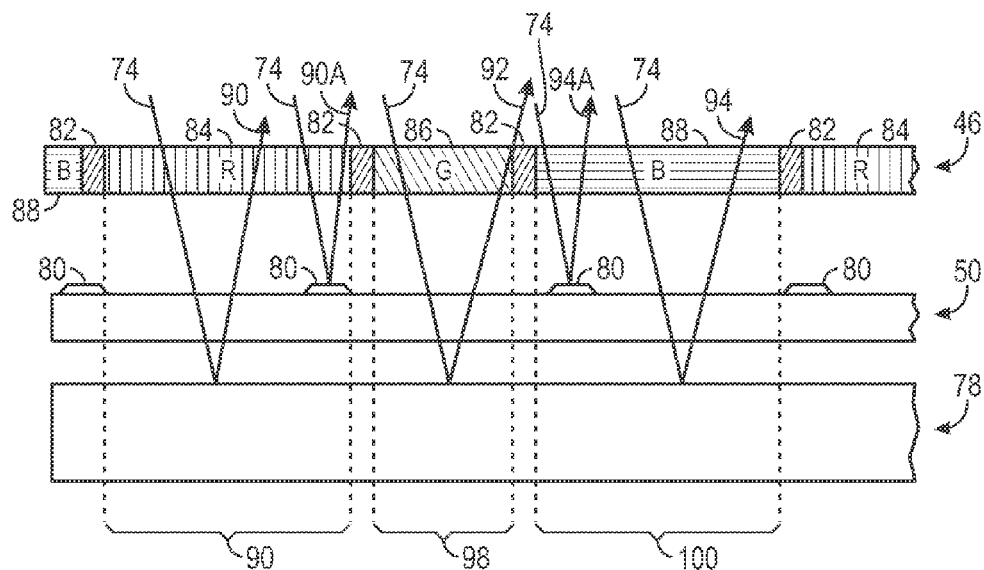
FIG. 7 is a diagram representing increased light reflection through red and blue color filters in the display of FIG. 4 in accordance with aspects of the present disclosure.

In some embodiments, the color filter and black mask layer 46 may be configured such that a total light propagating out of the display 12 may be substantially neutral in color. As illustrated in FIG. 7, the color filter and black mask layer 46 may include red filters 84 and blue filters 88 each having larger areas than the area of green filters 86. In some embodiments, the red filter 84 and blue filter 88 may also be disposed over a reflective portion 80 of the TFT layer 50 for each corresponding pixel 96, 98, or 100. For example, the red filter 84 may be extended over the reflective portion 80 of a red pixel 96. In addition to the red light 90 reflecting from the backlight assembly 78 and through the red filter 84, red light 90a may also reflect from the reflective portion 80 and through the red filter 84. The green filter 86 may be significantly smaller in area (e.g., approximately 1% to 40% smaller in area) in comparison to the red filter 84, such that green light 86 is reflected from the backlight assembly 78, but not significantly from a reflective portion 80 corresponding to the green pixel 98. The blue filter 88 may be disposed over a reflective portion 80 corresponding to the blue pixel 100. For example, as illustrated in FIG. 7, the blue filter 88 may be disposed over a reflective portion 80 coupled to the blue pixel 100, such that blue light 94a is reflected from the reflective portion 80 through the blue filter 88, in addition to the blue light 94 reflected by the backlight assembly 78.

Moreover, in some embodiments, the reflective portions 80 may include reflective pixel elements and/or reflective materials disposed beneath certain filters in the color filter and black mask layer 46. As discussed, the reflective portions 80 may include TFTs, pixel electrodes, gate lines, etc. Additionally, the reflective portions 80 may also include reflective materials (e.g., aluminum) which are disposed beneath the red filter 84 and/or the blue filter 88, such that red light 90a and blue light 94a may be displayed on a display surface in addition to the red light 90, green light 92, and blue light 94 which is reflected from the backlight assembly 78 to be transmitted through the filters 84, 86, and 88.

Figure 8:
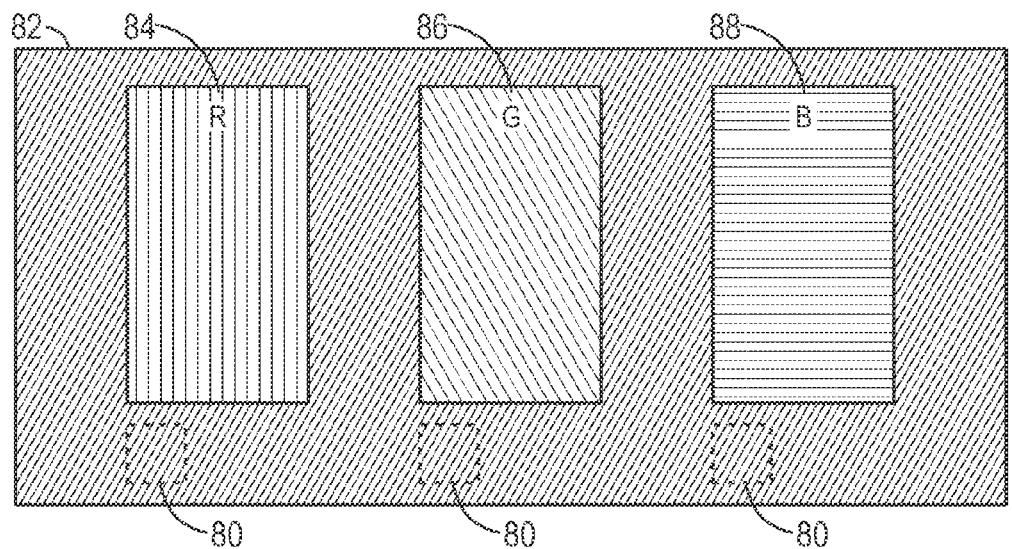
FIG. 8 is a top view of a color filter and black mask layer of red, green, and blue pixels.

A top view of a typical color filter and black mask layer (for which the cross-sectional side view is illustrated in FIG. 6) is provided in FIG. 8, where each of the red filter 84, green filter 86, and blue filter 88 has approximately the same area which is defined by the surrounding black mask 82. The black mask 82 may also be disposed over reflective portions 80 of each pixel.

Figure 9:
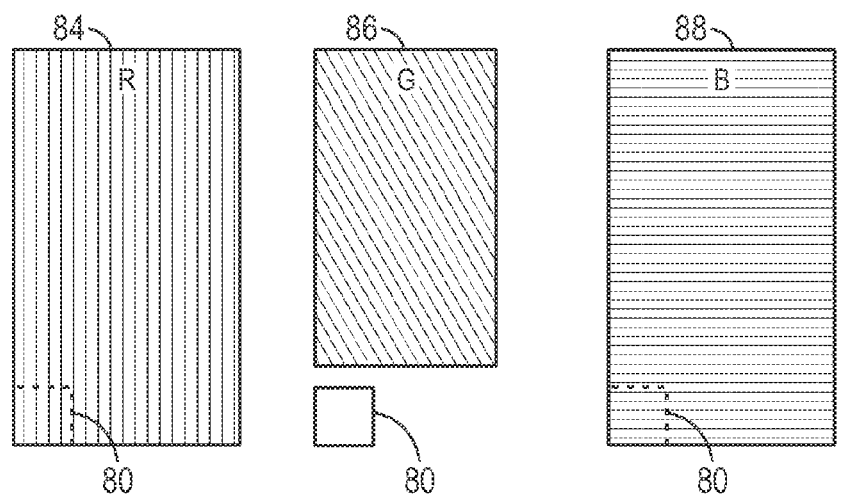
FIG. 9 is a top view of red, green, and blue color filter pigment resin areas in a first embodiment in accordance with aspects of the present disclosure.

FIG. 9 illustrates a top view of one embodiment including a red color filter 84, a green color filter 86, and a blue color filter 88. The top view of the color filters 84, 86, and 88 may illustrate the color filter portion of the embodiment illustrated in the cross-sectional side view of FIG. 7. Though not necessarily drawn to scale, FIG. 9 represents that each of the red color filter 84 and the blue color filter 88 are larger in area than the green color filter 86. Furthermore, in some embodiments, the red and blue color filters 84 are also disposed over the corresponding reflective portions 80 of red and blue pixels.

Figure 10:
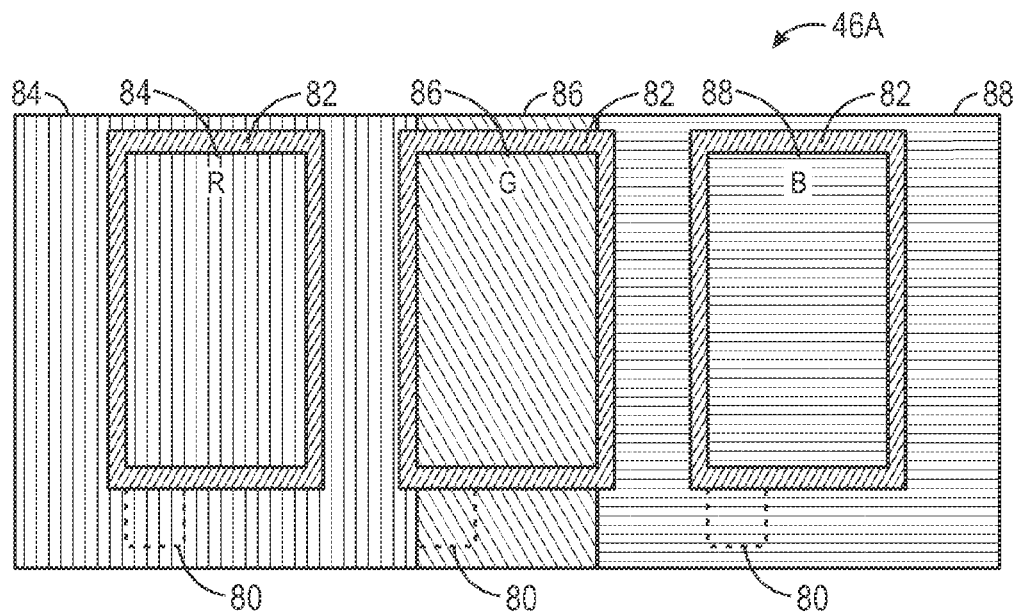
FIG. 10 is a top view of a color filter and black mask layer having controlled black mask areas over the red and blue pixels in a second embodiment in accordance with aspects of the present disclosure.

In some embodiments, as illustrated in the color filter and black mask layer 46a of FIG. 10, the black mask 82 may be shaped such that red and blue pixels have a larger area of a red filter 84 and blue filter 88 compared to an area of green filter 86. For example, in some embodiments, the areas of the each of the red filter 84 and blue filter 88 may be approximately 1% to 40% larger in area than the area of the green filter 86. The red and blue filters 88 may be areas of pigment resin rather than areas of black mask material. Impinging light 74 (FIGS. 6 and 7) which reflects from reflective optical layers of the backlight assembly 78 or from a reflective portion 80 of a red pixel 96 or a blue pixel 100 may pass through the red filter 84 or blue filter 88 to be viewed as red light 90 or blue light 94.

Figure 11:
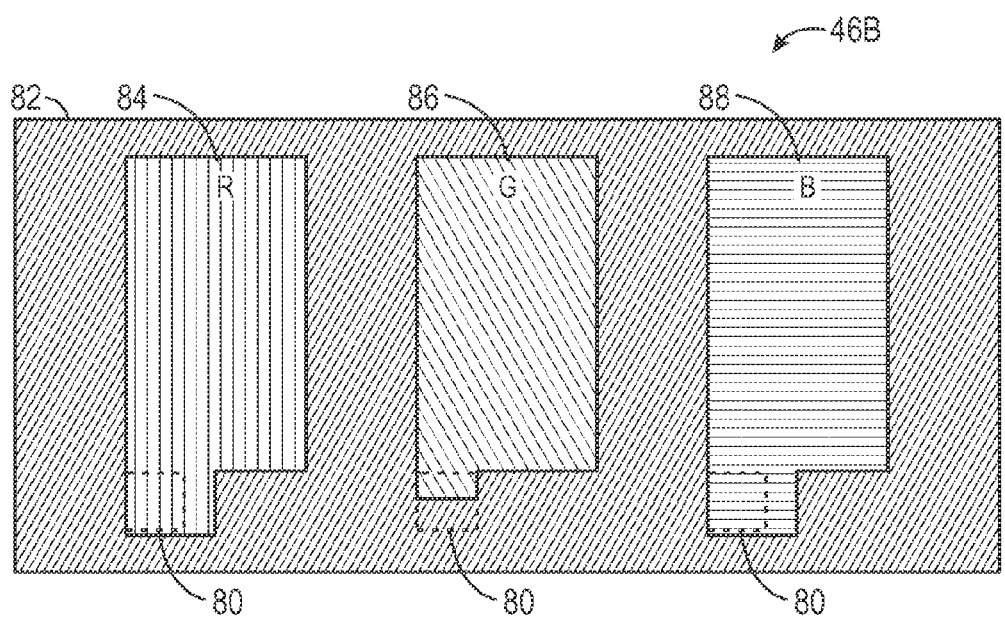
FIG. 11 is a top view of a color filter and black mask layer having exposed color filter regions over reflective areas in the red and blue pixels in a third embodiment, in accordance with aspects of the present disclosure.

FIG. 11 illustrates yet another embodiment of a color filter and black mask layer 46b configured to increase the areas through which light can be reflected as red light 90 and blue light 94. The red filter 84 and the blue filter 88 may each be disposed over respective reflective portions 80, such that impinging light 74 may be reflected off the reflective portions 80 and transmitted through the red filter 84 or blue filter 88 to be viewed as red light 90 or blue light 94. The black mask 82 may surround the red and blue filters 84 and 88 without covering the reflective portions 80 of the red and blue pixels 96 and 100. In some embodiments, the green filter 86 may also be extended over a portion of a respective reflective portion 80. For example, such techniques may increase the total reflection the display 12, thereby increasing illumination from the display 12 in brightly lit environments.

In accordance with the present techniques, even if green light 92 tends to attenuate less than red light 90 or blue light 94, the larger areas of the red filter 84 and/or blue filter 88 may compensate for such properties of light, such that the total red light 90 (and 90a), green light 92, and blue light 94 (and 94a) may be substantially neutral in color.

The present techniques may include any combination of the embodiments described above, as well as various other configurations of red filters 84, green filters 86, blue filters 88, and black mask 84. In some embodiments, the red filter 84, green filter 86, and blue filter 88 may all have different sizes of exposed areas in the black mask 84. For example, in some embodiments, only one of the red filter 84, green filter 86, or blue filter 88 may be disposed over a larger area than the other filters. Depending on the configuration of the display 12, the pigment resin filters in the color filter and black mask layer 46 may be configured such that the light propagating out of the display surface may be substantially neutral in color, even in brightly lit environments. Embodiments may include any combination of configuring the areas through which light can be reflected as red light 90, green light 92, or blue light 94, such that the light propagating from the display surface may be substantially neutral.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A display device comprising:
   a thin film transistor (TFT) layer comprising a plurality of reflective portions, a red pixel, a blue pixel, and a green pixel, wherein each reflective portion of the plurality of reflective portions comprises a data line, a gate line, or any combination thereof; and
   a color filter and black mask layer disposed over the TFT layer, wherein the color filter and black mask layer comprises:
      a red color filter configured to be disposed over the red pixel of the display device;
      a blue color filter configured to be disposed over the blue pixel of the display device;
      a green color filter configured to be disposed over the green pixel of the display device, wherein an area of at least one of the red color filter and the blue color filter is greater than an area of the green color filter; and
      a black mask configured to be disposed over a first reflective portion of the plurality of reflective portions, wherein the first reflective portion is coupled to the green pixel of the display device, and wherein a segment of a second reflective portion of the plurality of reflective portions coupled to either the red pixel or the blue pixel of the display device is not configured to be covered by the black mask.

2. The display device of claim 1, wherein each reflective portion of the plurality of reflective portions is coupled to one of the red pixel, the blue pixel, or the green pixel, wherein at least one of the red color filter and the blue color filter is disposed over the segment of the second reflective portion of the plurality of reflective portions.

3. The display device of claim 2, comprising one or more optical films disposed under the TFT layer, wherein the one or more optical films are configured to reflect impinging external light towards the color filter and black mask layer, wherein a total reflection out of the display surface is substantially neutral, wherein the total reflection out of the display surface comprises light reflected from the one or more optical films and light reflected from the segment of the second reflective portion of the plurality of reflective portions through at least one of the red color filter and the blue color filter.

4. The display device of claim 1, wherein the black mask is configured to separate the red, green, and blue color filters such that the area of the green color filter surrounded by the black mask is smaller than at least one of the area of the red color filter surrounded by the black mask and the area of the blue color filter surrounded by the black mask.

5. The display device of claim 4, wherein the color filter and black mask layer is configured such that the area of the green color filter surrounded by the black mask is approximately 1% to 40% smaller than at least one of the area of the red color filter surrounded by the black mask and the area of the blue color filter surrounded by the black mask.

6. The display device of claim 1, wherein the color filter and black mask layer is configured such that a total light reflection out of a display surface of the display device is substantially neutral, wherein the total light reflection comprises a red light reflecting out of the red color filter, a green light reflecting out of the green color filter, and a blue light reflecting out of the blue color filter.

7. The display device of claim 1, comprising a backlight assembly configured to illuminate light towards a display surface of the display device, wherein the TFT layer is disposed over the backlight assembly.

8. The display device of claim 1, wherein the area of at least one of the red color filter and the blue color filter is approximately 1% to 40% larger than the area of the green color filter.

9. A display device, comprising:
a pixel matrix comprising a red pixel, a blue pixel, and a green pixel;
a red color filter disposed over the red pixel and first reflective portion coupled to the red pixel, wherein the first reflective portion comprises a first data line coupled to the red pixel, a first gate line coupled to the red pixel, or any combination thereof, the red color filter is configured to pass light having wavelengths in a visible red spectrum, and the first reflective portion is configured to reflect a portion of external light impinging the first reflective portion through the red color filter;
a blue color filter disposed over the blue pixel and a second reflective portion coupled to the blue pixel, wherein the second reflective portion comprises a second data line coupled to the blue pixel, a second gate line coupled to the blue pixel, or any combination thereof, the blue color filter is configured to pass light having wavelengths in a visible blue spectrum, and the second reflective portion is configured to reflect a portion of external light impinging the second reflective portion through the blue color filter;
a green color filter disposed over the green pixel, wherein the green color filter is configured to pass light having wavelengths in a visible green spectrum; and
a black mask configured to separate the red color filter, the green color filter, and the blue color filter from one another, wherein the black mask is disposed over a third reflective portion coupled to the green pixel,
wherein the third reflective portion comprises a third data line coupled to the green pixel, a third gate line coupled to the green pixel, or any combination thereof, and wherein the black mask does not cover either a first segment of the first reflective portion or a second segment of the second reflective portion.

10. The display device of claim 9, wherein an area of each of the red color filter and the blue color filter is greater than the area of the green color filter.

11. The display device of claim 9, wherein the black mask is configured to surround an area of the red color filter disposed over the first segment of the first reflective portion.

12. The display device of claim 9, wherein the black mask is configured to surround an area of the blue color filter disposed over the second segment of the second reflective portion.

13. The display device of claim 9, comprising one or more optical films configured to reflect external light impinging the display device, wherein the one or more optical films is configured to reflect portions of the external light through the red color filter, the green color filter, or the blue color filter.

14. The display device of claim 13, wherein a combination of light reflected by the one or more optical films and light reflected by the first and second reflective portions which propagate out of a display surface of the display device is substantially neutral in color.

15. The display device of claim 9, wherein an area of one or more of the red color filter and the blue color filter is approximately 1% to 40% larger than an area of the green color filter.

16. A method of controlling a color of total reflected light from a display device, the method comprising:
reflecting light from an optical film in a backlight assembly of the display device;
color filtering the reflected light from the optical film using a plurality of color filters in a color filter and black mask layer, wherein the color filter and black mask layer comprises a black mask, a plurality of red color filters disposed over a plurality of red pixels, a plurality of green color filters disposed over a plurality of green pixels, and a plurality of blue color filters disposed over a plurality of blue pixels;
displaying the color filtered reflected light from the optical film on the display surface;
reflecting light from a plurality of reflective portions disposed on a thin film transistor (TFT) layer of the display device, wherein each reflective portion comprises a data line, a gate line, or any combination thereof, and each reflective portion of the plurality of reflective portions is coupled to a respective red pixel of the plurality of red pixels or a respective blue pixel of the plurality of blue pixels;
color filtering the reflected light from the plurality of reflective portions through one of the plurality of red color filters and the plurality of blue color filters in the color filter and black mask layer, wherein the black mask is disposed over each reflective portion coupled to a respective green pixel of the plurality of green pixels, the black mask does not cover first segments of each reflective portion coupled to a respective red pixel of the plurality of red pixels, and the black mask does not cover second segments of each reflective portion coupled to a respective blue pixel of the plurality of blue pixels; and
displaying the color filtered reflected light from the plurality of reflective portions on the display surface such that the total reflected light displayed on the display surface is substantially neutral in color, wherein the total reflected light displayed on the display surface comprises reflected light from the optical film, reflected light from the first segments of the reflective portions coupled to the plurality red pixels, and reflected light from the second segments of the reflective portions coupled to the plurality of blue pixels.

17. The method of claim 16, wherein the reflected light from the optical film is displayed on the display surface substantially concurrently with the reflected light from the plurality of reflective portions.

18. The method of claim 16, comprising transmitting internal light from a backlight assembly through the plurality of color filters in the color filter and black mask layer, wherein the total reflected light comprises the internal light transmitted through the plurality of color filters.

19. A method of manufacturing a display device having reduced discoloration, the method comprising:
providing a display panel configured to emit modulated light to be displayed through the display device, wherein the display panel comprises first reflective portions and second reflective portions, and each first reflective portion comprises a data line, a gate line, or any combination thereof;
configuring a color filter and black mask layer to comprise an arrangement of red color filters, green color filters, and blue color filters each surrounded by black mask material, such that the red color filters are each larger than each of the green color filters; and
disposing the color filter and black mask layer over the display panel, wherein the black mask material surrounding the red color filters and the blue color filters does not cover segments of the first reflective portions disposed under the red color filters and the blue color filters, and the black mask material surrounding the green color filters is configured to cover the second reflective portions disposed under the green color filters.

20. The method of claim 19, wherein the red color filters are each configured to be approximately 1% to 40% larger in area than each of the green color filters.

21. The method of claim 19, wherein configuring the color filter and black mask layer comprises configuring each of the blue color filters to be larger in area than each of the green color filters.

22. The method of claim 19, wherein the blue color filters are each configured to be approximately 1% to 40% larger in area than each of the green color filters.

* * * * *